United States Patent
Li et al.

(10) Patent No.: US 10,879,371 B2
(45) Date of Patent: Dec. 29, 2020

(54) THERMAL TREATMENT FOR GATE DIELECTRICS

(71) Applicant: Taiwan Semiconductor Manufacturing Company, Ltd., Hsinchu (TW)

(72) Inventors: Yi-Yun Li, Hsinchu (TW); Huicheng Chang, Tainan (TW); Che-Hao Chang, Hsinchu (TW); Hung-Yao Chen, Hsinchu (TW); Cheng-Po Chau, Tainan (TW); Xiong-Fei Yu, Hsinchu (TW); Terry Huang, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 92 days.

(21) Appl. No.: 16/005,820

(22) Filed: Jun. 12, 2018

(65) Prior Publication Data
US 2019/0378913 A1     Dec. 12, 2019

(51) Int. Cl.
| | |
|---|---|
| *H01L 29/66* | (2006.01) |
| *H01L 21/8234* | (2006.01) |
| *H01L 21/28* | (2006.01) |
| *H01L 29/78* | (2006.01) |
| *H01L 27/088* | (2006.01) |

(52) U.S. Cl.
CPC .. *H01L 29/66545* (2013.01); *H01L 21/28185* (2013.01); *H01L 21/823418* (2013.01); *H01L 21/823431* (2013.01); *H01L 21/823462* (2013.01); *H01L 27/0886* (2013.01); *H01L 29/66795* (2013.01); *H01L 29/785* (2013.01)

(58) Field of Classification Search
CPC ......... H01L 29/66545; H01L 21/28185; H01L 21/823418; H01L 21/823431; H01L 21/823462; H01L 27/0886; H01L 29/66795; H01L 29/785
See application file for complete search history.

(56) References Cited

U.S. PATENT DOCUMENTS

| | | | | |
|---|---|---|---|---|
| 5,563,093 | A | * 10/1996 | Koda | ........... H01L 21/2022 438/231 |
| 6,486,020 | B1 | * 11/2002 | Thakur | ........... H01L 21/32105 257/310 |

(Continued)

*Primary Examiner* — Fernando L Toledo
*Assistant Examiner* — Neil R Prasad
(74) *Attorney, Agent, or Firm* — Slater Matsil, LLP (57) ABSTRACT

Embodiments described in this disclosure relate to formation of a gate structure of a device, such as in a replacement gate process, and the device formed thereby. In some examples, after an interfacial layer and a gate dielectric layer are deposited, a rapid anneal process, such as laser anneal or flash lamp anneal process, is performed in a controlled ambient nitrogen-containing environment to form a nitrided portion in the gate dielectric layer. The nitrided portion passivates the defects at the surface of the gate dielectric layer and can serve as a barrier to prevent etchant chemistry and defects/dopants from the subsequent gate stack layers from affecting or diffusing through the gate dielectric layer. Particularly, the rapid anneal process is performed on a millisecond scale to confine nitrogen atoms in the gate dielectric layer without diffusing into the underlying interfacial dielectric and/or any neighboring structure such as fin.

20 Claims, 7 Drawing Sheets

(56) References Cited

U.S. PATENT DOCUMENTS

| | | | | |
|---|---|---|---|---|
| 2002/0096721 A1* | 7/2002 | Mogami | ............ | H01L 21/28185 257/350 |
| 2008/0069550 A1* | 3/2008 | Timans | ................... | C30B 31/12 392/411 |
| 2012/0256238 A1* | 10/2012 | Ning | ....................... | H01L 21/84 257/280 |
| 2014/0179110 A1* | 6/2014 | Park | .................. | H01L 21/02046 438/715 |
| 2015/0102431 A1* | 4/2015 | Chi | ................... | H01L 21/28185 257/411 |
| 2015/0255277 A1* | 9/2015 | Tong | ..................... | H01L 29/785 257/288 |

\* cited by examiner

THERMAL TREATMENT FOR GATE DIELECTRICS

BACKGROUND

As the semiconductor industry has progressed into nanometer technology process nodes in pursuit of higher device density, higher performance, and lower costs, challenges from both fabrication and design issues have resulted in the development of three-dimensional designs, such as a Fin Field Effect Transistor (FinFET). FinFET devices typically include semiconductor fins with high aspect ratios and in which channel and source/drain regions are formed. A gate is formed over and along the sides of the fin structure (e.g., wrapping) utilizing the advantage of the increased surface area of the channel to produce faster, more reliable, and better-controlled semiconductor transistor devices.

To reduce gate leakage current and produce equivalent field effect performance, high-k dielectric materials are used in gate structure for FinFET devices. However, with the decreasing in scaling, new challenges are presented.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides example embodiments relating to formation of a gate structure of a device, such as a high-k metal gate semiconductor transistor. More specifically, in some examples, after an interfacial layer and a high-k dielectric layer are deposited over a semiconductor fin structure, the high-k dielectric layer is subjected to a thermal treatment, which can be a high temperature, millisecond annealing process, in a controlled nitrogen-containing ambient to incorporate nitrogen in the high-k dielectric layer. Millisecond annealing processes can confine nitrogen in the high-k dielectric layer and re-activate dopants in the source/drain regions with minimized diffusion of the dopants from the source/drain regions. As a result, short channel effect can be prevented. The nitrogen-containing ambient also avoids regrowth of the interfacial layer during the annealing process. Among other benefits, device degradation, such as time-dependent dielectric breakdown (TDDB), and device performance can be improved.

The foregoing broadly outlines some aspects of embodiments described in this disclosure. It is contemplated that the concepts of the present disclosure may be implemented for a planar transistor device or for a three-dimensional transistor device, such as the semiconductor device 40 described in this disclosure. Some example devices for which aspects described herein may be implemented include fin field effect transistors (FinFETs), Horizontal Gate All Around (HGAA) FETs, Vertical Gate All Around (VGAA) FETs, nanowire channel FETs, strained-semiconductor devices, or silicon-on-insulator (SOI) devices.

Figure 1:
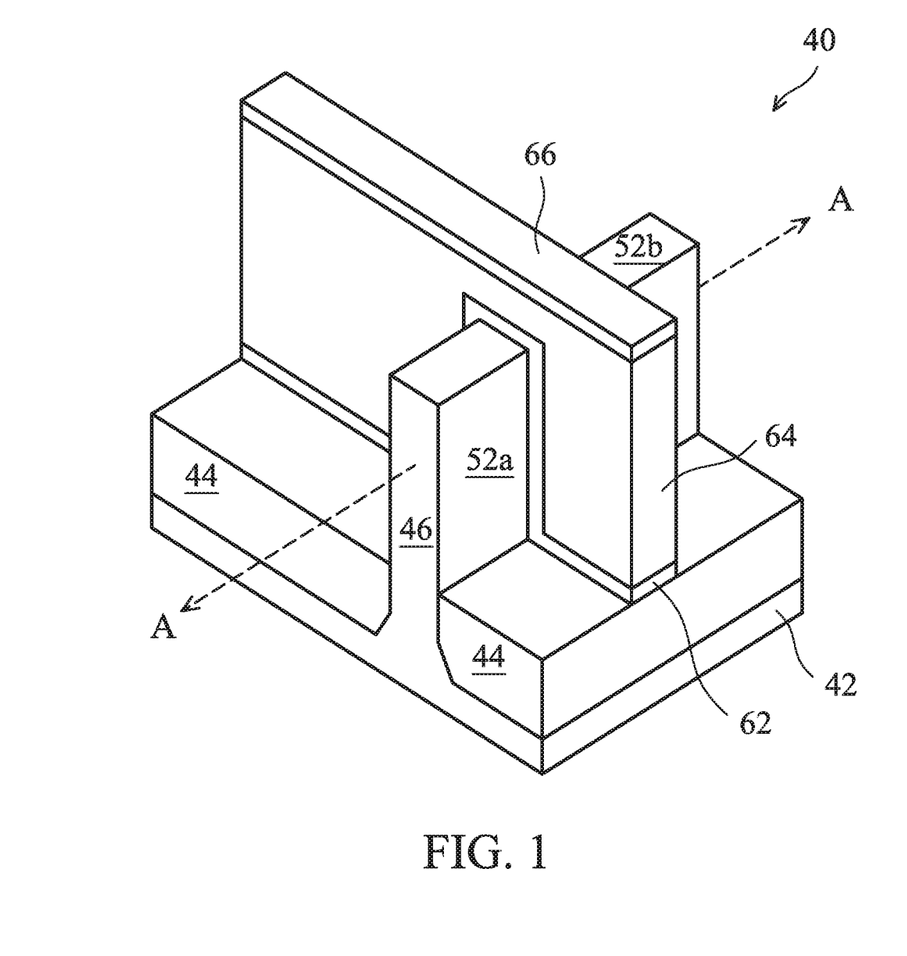
FIG. 1 is a three-dimensional view of an example intermediate Fin Field Effect Transistor (FinFET) structure in accordance with some embodiments.

FIG. 1 illustrates a three-dimensional view of an example of a semiconductor device 40 in accordance with some embodiments. In an embodiment, the semiconductor device 40 is an intermediate Fin Field Effect Transistor (FinFET) structure. A person having ordinary skill in the art will readily understand modifications to embodiments described herein to achieve implementations in other contexts. Although various operations are illustrated in the drawings and described herein, no limitation regarding the order of such steps or the presence or absence of intervening steps is implied. Operations depicted or described as sequential are, unless explicitly specified, merely done so for purposes of explanation without precluding the possibility that the respective steps are actually performed in concurrent or overlapping manner, at least partially, if not entirely.

The semiconductor device 40 includes a fin 46 on a semiconductor substrate 42. The fin 46 may be formed from and extended upwardly from a surface of the semiconductor substrate 42. The semiconductor substrate 42 includes isolation regions 44, and the fin 46 protrudes through and above the isolation regions 44. In the example shown, the fin 46 protrudes from between the neighboring isolation regions 44. A dummy gate stack, which includes an interfacial dielectric 62, a dummy gate layer 64 over the interfacial dielectric 62, and a mask layer 66 over the dummy gate layer 64, is disposed along sidewalls and over a top surface of the fin 46. Source/drain regions 52a and 52b are disposed in opposing regions of the fin 46 with respect to the dummy gate stack. FIG. 1 further illustrates a reference cross-section A-A that is used for subsequent figures. Cross-section A-A is in a plane along, e.g., a channel in the fin 46 between the opposing source/drain regions 52a and 52b.

Figure 2:
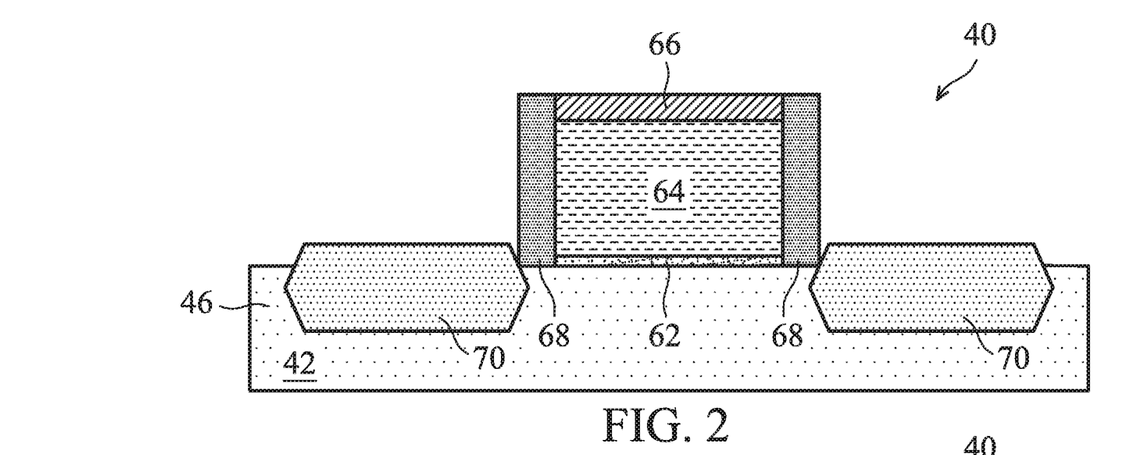
FIGS. 2 through 5 and 8 through 10 illustrate cross-sectional views (e.g., along cross-section A-A of FIG. 1) of respective intermediate structures during an example method for forming a semiconductor device in accordance with some embodiments.

FIGS. 2 through 10 illustrate cross-sectional views (e.g., along cross-section A-A of FIG. 1) of respective intermediate structures during an example method for forming a semiconductor device in accordance with some embodiments. The semiconductor device can be a Field Effect Transistor (FET), which may be a FinFET structure 40 like shown in FIG. 1. FIG. 2 illustrates a semiconductor substrate 42 with at least a portion of the semiconductor device formed thereon. The semiconductor substrate 42 may be or include a bulk semiconductor, a semiconductor-on-insulator (SOI) substrate, or the like, which may be doped (e.g., with a p-type or an n-type dopant) or undoped. In some embodiments, the semiconductor material of the semiconductor substrate 42 may include an elemental semiconductor such as silicon (Si) or germanium (Ge); a compound semiconductor; an alloy semiconductor; or a combination thereof. Generally, fins 46 can be formed in the semiconductor substrate 42 by etching trenches in the semiconductor substrate 42 using photolithography and etching processes. Insulating material, such as silicon oxide, silicon nitride, the like, multi-layers thereof, or a combination thereof, can be deposited in the trenches and recessed to form the isolation regions 44 with the fins 46 protruding therefrom.

The interfacial dielectric 62, dummy gate layer 64, and mask layer 66 for the dummy gate stack may be formed by sequentially forming or depositing the respective layers by any suitable processes, and then patterning those layers into the dummy gate stack. For example, the interfacial dielectric 62 may include or be silicon oxide, silicon nitride, the like, or multilayers thereof; the dummy gate layer 64 may include or be silicon (e.g., amorphous silicon or poly-silicon) or any suitable material; and the mask layer 66 may include or be silicon nitride, silicon oxynitride, silicon carbon nitride, the like, or a combination thereof. The layers for the interfacial dielectric 62, dummy gate layer 64, and mask layer 66 may then be patterned to form the dummy gate stack, for example, using photolithography and one or more etch processes.

FIG. 2 illustrates gate spacers 68 formed along sidewalls of the dummy gate stack (e.g., sidewalls of the interfacial dielectric 62, dummy gate layer 64, and mask layer 66) and over the fin 46 on the semiconductor substrate 42. The gate spacers 68 may be formed by conformally depositing one or more layers for the gate spacers 68 and anisotropically etching the one or more layers, for example. The one or more layers for the gate spacers 68 may include or be silicon nitride, silicon oxynitride, silicon carbon nitride, the like, multi-layers thereof, or a combination thereof.

Source/drain regions 70 are then formed in the fin 46 on opposing sides of the dummy gate stack. In some examples, the source/drain regions 70 are formed by implanting dopants into the fin 46 using the dummy gate stack and gate spacers 68 as a mask. In other examples, such as illustrated, the fin 46 may be recessed, by an etching process, using the dummy gate stack and gate spacers 68 as a mask, and epitaxial source/drain regions 70 may be epitaxially grown in the recesses. The epitaxial source/drain regions 70 may include or be silicon germanium, silicon carbide, silicon phosphorus, germanium, a III-V compound semiconductor, a II-VI compound semiconductor, or the like. Epitaxial source/drain regions 70 may be raised in relation to the fin 46, as illustrated. The epitaxial source/drain regions 70 may be doped by in-situ doping during the epitaxial growth and/or by implantation after the epitaxial growth. Hence, source/drain regions 70 can be formed by epitaxial growth, and possibly with implantation, on opposing sides of the dummy gate stack.

Figure 3:
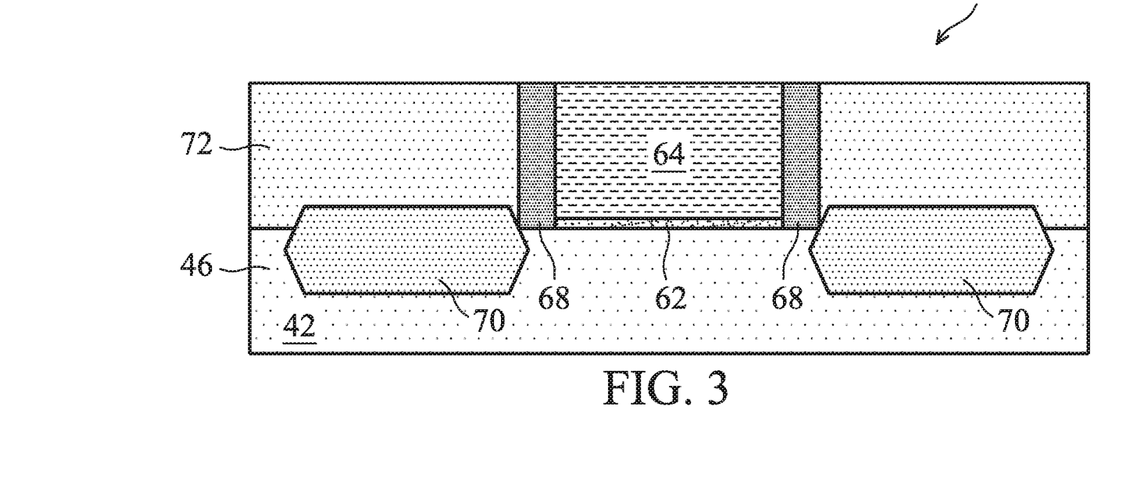

FIG. 3 illustrates the formation of a first interlayer dielectric (ILD) 72 over the fin 46 of the semiconductor substrate 42 and along the gate spacers 68. Although not specifically illustrated, a contact etch stop layer (CESL) may be conformally formed over the fin 46 of the semiconductor substrate 42 and along the gate spacers 68, and the first ILD 72 can be formed over the CESL, in some examples. Generally, an etch stop layer can provide a mechanism to stop an etch process when forming, e.g., contacts or vias. An etch stop layer may be formed of a dielectric material having a different etch selectivity from adjacent layers, for example, the first ILD 72. For example, the CESL may be conformally deposited over the fin 46, dummy gate stack, and gate spacers 68. The CESL may comprise or be silicon nitride, silicon carbon nitride, silicon carbon oxide, carbon nitride, the like, or a combination thereof. Then, for example, the first ILD 72 is deposited over the CESL. The first ILD 72 may include or be silicon dioxide, a low-k dielectric material (e.g., a material having a dielectric constant lower than silicon dioxide), silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), SiOxCy, Spin-On-Glass, Spin-On-Polymers, silicon carbon material, a compound thereof, a composite thereof, the like, or a combination thereof.

The first ILD 72 can be planarized, such as by a Chemical Mechanical Polish (CMP), after being deposited. The top surface of the first ILD 72 is planarized to be coplanar with the top surface of the dummy gate layer 64 to thereby expose the dummy gate layer 64 through the first ILD 72. The planarization may remove the mask layer 66 of the dummy gate stack (and, in some instances, upper portions of the gate spacers 68), and accordingly, the top surface of the dummy gate layer 64 of the dummy gate stack is exposed through the first ILD 72.

Figure 4:
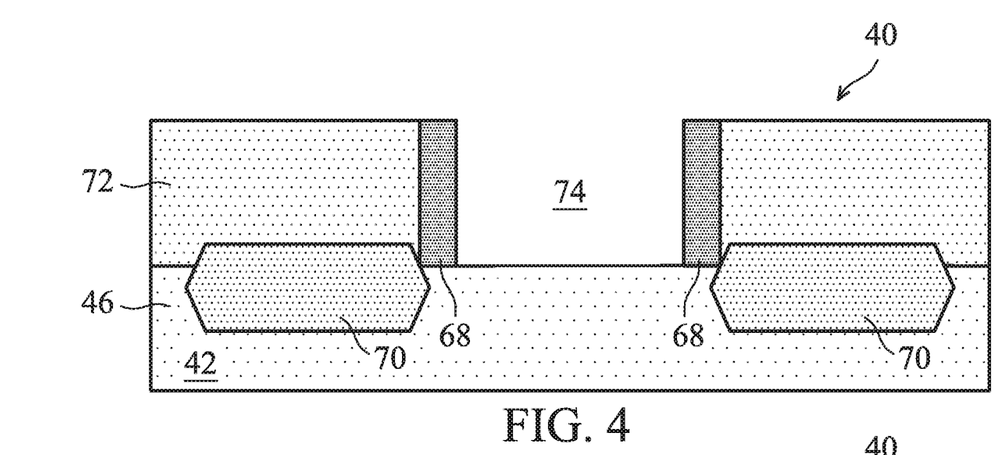

FIG. 4 illustrates the removal of the dummy gate stack, which forms a recess 74 between the gate spacers 68. Once exposed through the first ILD 72, the dummy gate layer 64 and interfacial dielectric 62 of the dummy gate stack are removed, such as by one or more etch processes.

Figure 5:
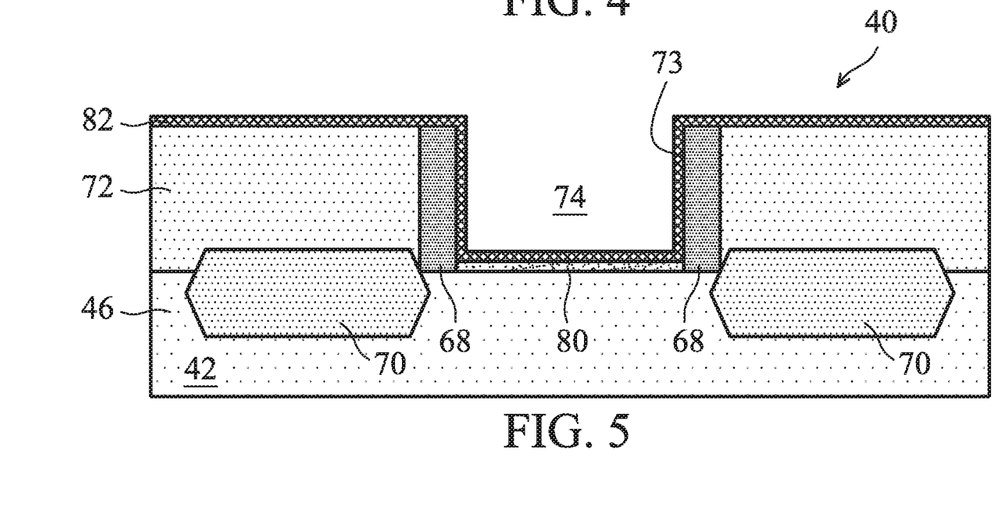

FIG. 5 illustrates the formation of an interfacial dielectric 80 and a gate dielectric layer 82 in the recess 74. In some examples, such as illustrated, the interfacial dielectric 80 is formed on the fin 46 of the semiconductor substrate 42 exposed through the recess 74 and between the gate spacers 68. The interfacial dielectric 80 can be an oxide (e.g., silicon oxide) formed by thermal or chemical oxidation of the fin 46, nitride (e.g., silicon nitride), and/or another dielectric layer using any suitable deposition technique. In some examples, the interfacial dielectric 62 of the dummy gate stack can remain and be in the place of the interfacial dielectric 80. In further examples, the interfacial dielectric 80 may result from various processing steps, such as being a native oxide formed as a result of a cleaning process. In other examples, the interfacial dielectric 80 may be omitted.

The gate dielectric layer 82 is conformally deposited in the recess 74 where dummy gate stacks were removed (e.g., over the interfacial dielectric 80, along sidewalls 73 of the gate spacers 68) and over top surfaces of the gate spacers 68 and first ILD 72, and the CESL (if used). The gate dielectric layer 82 and the interfacial dielectric 80 may be described as a high-k gate stack. The gate dielectric layer 82 can be or include silicon oxide, silicon nitride, a high-k dielectric material, multilayers thereof, or other dielectric material. A high-k dielectric material may have a k value of about about 7.0 or greater, and may include a metal oxide of or a metal silicate of Hf, Al, Zr, La, Mg, Ba, Ti, Pb, or a combination thereof. Some examples for the gate dielectric layer 82 may include, but are not limited to, $TiO_2$, $HfO_2$, $HfZrO$, $Ta_2O_3$, $HfSiO_4$, $ZrO_2$, $ZrSiO_2$, etc. In some embodiments, the gate dielectric layer 82 is hafnium oxide ($HfO_2$). The gate dielectric layer 82 can be deposited by atomic layer deposition (ALD), plasma enhanced chemical vapor deposition (PECVD), molecular beam deposition (MBD), or any suitable deposition technique. The gate dielectric layer 82 can have a thickness in a range from about 5 Å to about 25 Å, for example about 16 Å.

After the gate dielectric layer 82 is formed on the interfacial dielectric 80, the semiconductor device 40 is subjected to a thermal treatment in a controlled ambient to dope nitrogen in the gate dielectric layer 82. Doping the gate dielectric layer 82 with nitrogen is found to possibly be advantageous because the nitrogen can passivate the defects at the surface of the gate dielectric layer 82, e.g., by filling the oxygen vacancies in the gate dielectric layer 82 and/or attaching to dangling bonds at the surface of the gate dielectric layer 82. The nitrogen can also increase the ability of the gate dielectric layer 82 to resist an etch during the subsequent patterning process(es) and provide a barrier against undesired diffusion of defects/dopants from the subsequent gate stack layers (e.g., a work-function tuning layer, a barrier/adhesion layer, and a gate metal fill) to be formed over the gate dielectric layer 82. Various thermal treatments discussed below include the use of a high temperature, rapid anneal process to provide a desired nitrogen concentration in the gate dielectric layer 82, which thermal treatments may prevent nitrogen from diffusing into the interfacial dielectric 80, fin 46, and/or any underlying layer(s).

The rapid anneal process may be any suitable thermal process, such as a laser anneal process, a flash lamp anneal process, or any advanced process using suitable optical radiation for performing an anneal for a very short amount of time, e.g., on a millisecond time scale or below, for example nanosecond time scale or even picosecond time scale. During the thermal treatment, the semiconductor substrate 42 is pre-heated and maintained at a pre-heat temperature so that the rapid anneal process can be initiated on the semiconductor substrate 42 that is already at elevated temperatures to allow a reduced thermal exposure of the semiconductor substrate 42 to the high temperature anneal process. The pre-heat temperature may be low enough (e.g., about 800° C. or below) to avoid uncontrolled diffusion of dopants from the source/drain regions. This pre-heat stage in conjunction with the rapid anneal process can help limit the movement of the nitrogen atoms within the gate dielectric layer 82.

Once the semiconductor substrate 42 reaches the pre-heat temperature, a rapid anneal process is performed to further heat the substrate surface or at least portions of the substrate to an anneal temperature at or above the recrystallization point, but below the melting point of the gate dielectric layer 82. The rapid anneal process can create a more crystalline structure from regions of the gate dielectric layer 82 than were previously deposited with an amorphous structure. In most cases, the rapid anneal process can recrystallize the gate dielectric layer 82 within the anneal region to provide a crystallinity of at least 40% or above, such as about 45% to about 100%, for example about 50% to about 70%.

Depending upon the type of the rapid anneal process performed, the nitrogen is diffused into a depth of the gate dielectric layer 82 and converts at least a portion of the gate dielectric layer 82 into a nitride portion. In cases where the gate dielectric layer 82 is hafnium oxide ($HfO_2$), the nitride portion can be hafnium oxynitride having Hf—O—N bonds, or hafnium nitride having Hf—N bonds. The thickness of the nitrided portion to the overall thickness of the gate dielectric layer 82 may be at a ratio in a range from about 1:1.1 to about 1:2.5. As will be discussed in more detail below, the nitrided portion can be a plurality of localized nitrided regions distributed across and along the exposed surfaces of the gate dielectric layer 82 if a laser anneal process is used. If a flash lamp anneal process is used, the nitrided portion can be a uniform nitride layer formed across and along the exposed surfaces of the gate dielectric layer 82. In either case, the concentration of the nitride portion may be a gradient in the gate dielectric layer 82 along the thickness of the gate dielectric layer 82. For example, portions of the gate dielectric layer 82 inward to the gate replacement structure (e.g., distal from respective gate spacers 68 on which vertical portions of the gate dielectric layer 82 are disposed, and distal from the semiconductor substrate 42 on which a horizontal portion of the gate dielectric layer 82 is disposed) may have a greatest concentration of nitrogen in the gate dielectric layer 82, and the concentration of nitrogen decreases as the gate dielectric layer 82 is traversed away from the portions having the greatest concentration (e.g., traversed in an outwardly direction of the replacement gate structure).

Figure 6:
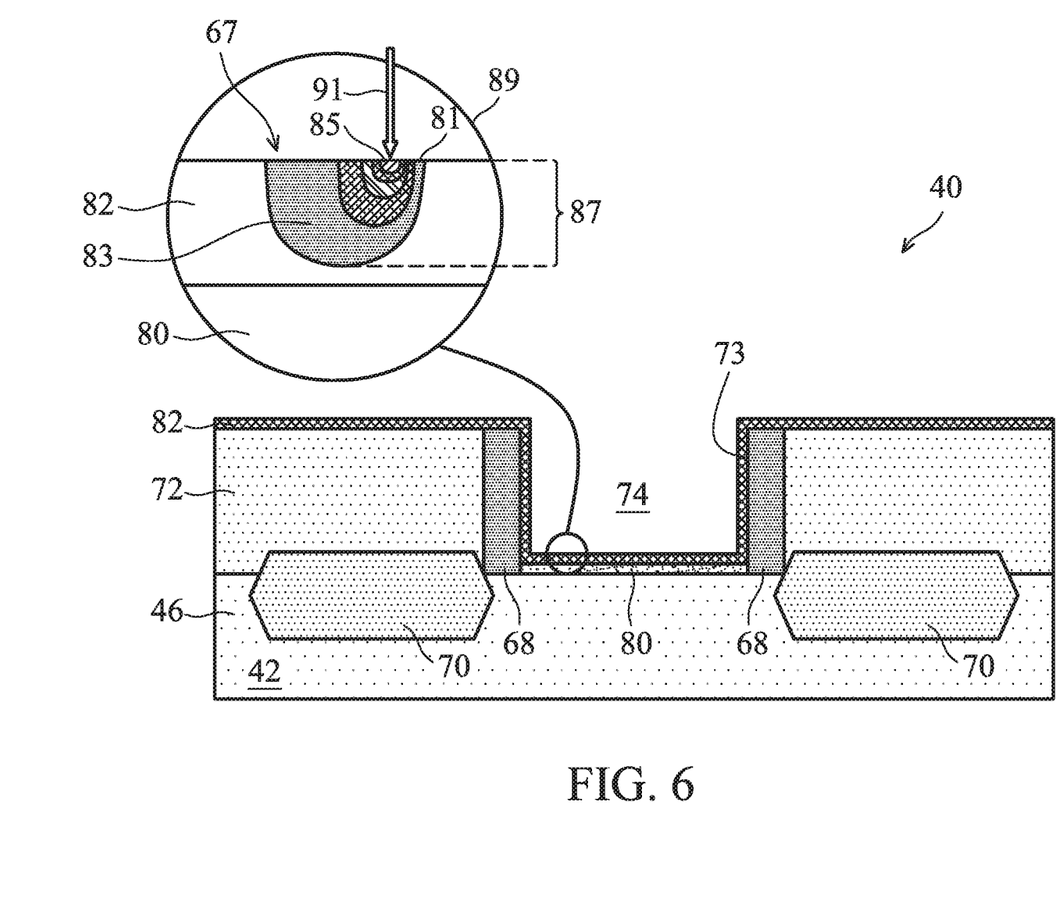
FIG. 6 is a cross-sectional view (e.g., along cross-section A-A of FIG. 1) of an intermediate structure showing a localized nitride region in a gate dielectric layer formed by a laser anneal process in accordance with some embodiments.

Inset 89 in FIG. 6 is a partially enlarged view showing a thermal gradient 87 in the gate dielectric layer 82 formed by a laser anneal process 91 according to some embodiments. The thermal gradient 87 may define a localized nitrided region 67 in the gate dielectric layer 82. As can be seen, a peak temperature region 85 may be formed at or near the top surface 81 of the gate dielectric layer 82 where the laser beam hits the top surface 81, and the temperature decreases radially from the peak temperature region 85 to a lower temperature region 83 that is away from the peak temperature region 85. Since the laser anneal process 91 is scanned over the top surface 81 and the dwell time of the laser beam is on a millisecond scale, the thermal gradient 87 can be limited within the gate dielectric layer 82 and does not extend into the interfacial dielectric 80. The anneal energy (and thus thermal gradient 87) may dissipate as soon as the laser beam scans over or moves to the next spot.

Figure 7:
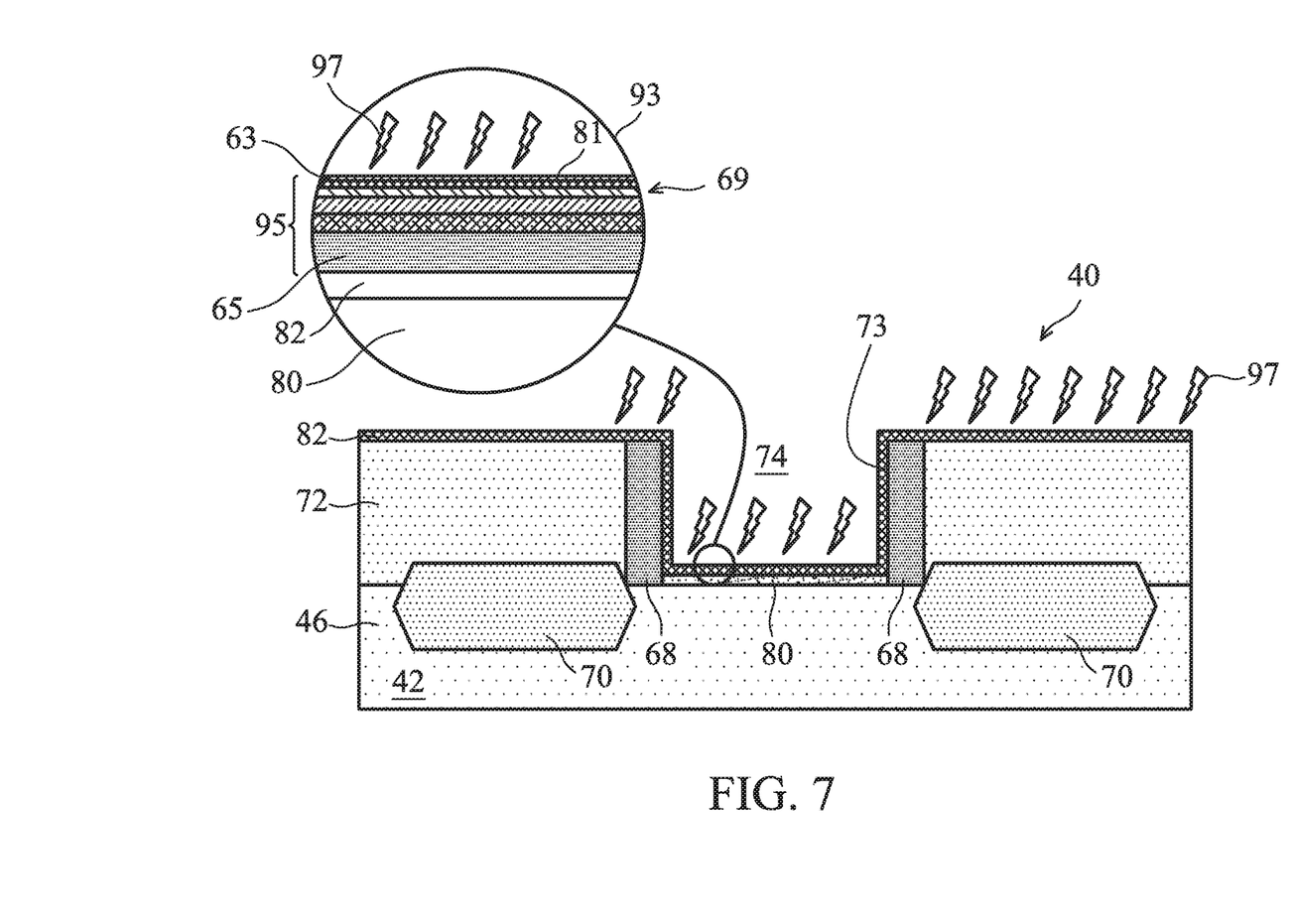
FIG. 7 is a cross-sectional view (e.g., along cross-section A-A of FIG. 1) of an intermediate structure showing a nitride layer in a gate dielectric layer formed by a flash lamp anneal process in accordance with some embodiments.

Inset 93 in FIG. 7 is a partially enlarged view showing a thermal gradient 95 in the gate dielectric layer 82 formed by a flash lamp anneal process 97 according to other embodiments. Because flash lamp irradiation is a flood irradiation process, the flash lamps can irradiate the entire area of the substrate surface in a single exposure. The thermal gradient 95 may define a nitrided layer 69 in the gate dielectric layer 82. The thermal gradient 95 may have a peak temperature region 63 and a lower temperature region 65 that is away from the peak temperature region 63. The temperature decreases along the thickness of the gate dielectric layer 82. Likewise, since the flash lamp anneal process 97 is performed for an extremely short duration, the thermal gradient 95 can be limited within the gate dielectric layer 82 and does not extend into the interfacial dielectric 80. The anneal energy (and thus thermal gradient 95) may dissipate as soon as the flash lamp is pulsed or turned off.

In either the laser anneal process 91 or flash lamp anneal process 97, the energy imparted may excite motion of nitrogen atoms within the anneal region which is subsequently frozen in the crystal lattice of the gate dielectric layer 82 as soon as the anneal energy dissipates within the substrate. Therefore, the laser anneal process 91 or the flash lamp anneal process 97 can limit movement of the nitrogen atoms in the crystal lattice of the gate dielectric layer 82 without diffusing through the entire thickness of the gate dielectric layer 82. As a result, the nitrogen atoms are confined within the gate dielectric layer 82 without diffusion into the interfacial dielectric 80 and/or the fin 46 that may otherwise cause the quality of the semiconductor device 40 to suffer. The interfacial dielectric 80 and/or the fin 46 is therefore nitrogen-free. In some embodiments, the dopant concentration (e.g., nitrogen atoms) in the gate dielectric layer 82 may be in a range from about 3 at. % to about 20 at. % (or in a range from about $0.5 \times 10^{21}$ atom/cm$^3$ to about $8 \times 10^{21}$ atom/cm$^3$).

In some embodiments, the thermal treatment is a laser anneal process performed in an ambient nitrogen-containing environment. The ambient nitrogen-containing environment may be created in a process chamber by introducing a gas consisting of, consisting essentially of, or comprising a nitrogen-containing gas such as $N_2$, $NH_3$, a combined gas of $N_2$ and $H_2$, and/or any mixtures thereof. In some examples, the ambient nitrogen-containing environment is created using $NH_3$. If desired, the nitrogen-containing gas may be optionally mixed with non-reactive gases, such as one or more of helium (He), argon (Ar), neon (Ne), xenon (Xe), or the like. The process chamber may be any suitable process chamber, or combination of process chambers suitable for forming and annealing the gate dielectric layer 82.

Before and/or while the nitrogen-containing gas is introduced into the process chamber, the substrate support (e.g., a chuck for supporting the semiconductor device 40) is pre-heated and maintained at a pre-heat temperature in a range form about 150° C. to about 650° C., such as about 200° C. to about 600° C., for example about 250° C. to about 500° C. The substrate support may be maintained at the pre-heat temperature for a duration in a range from about 2 seconds to about 20 seconds, for example about 8 seconds to about 10 seconds. A laser anneal process is then performed by scanning a laser beam from an energy source across the exposed surface of the gate dielectric layer 82 to form a plurality of localized nitrided regions, such as localized nitrided region 67 of FIG. 6, in the gate dielectric layer 82. The laser beam may be applied/scanned sequentially to portions of the gate dielectric layer 82 of the semiconductor device 40. For example, the laser beam may anneal a first portion of the gate dielectric layer 82, then the semiconductor substrate 42 and/or laser beam may be moved, and the laser beam may anneal a second portion of the gate dielectric layer 82.

The energy source may be any type of laser such as gas laser, excimer laser, solid-state laser, fiber laser, semiconductor laser, etc. The laser beam may have a constant energy flux. The laser beam may be delivered to the surface of the gate dielectric layer 82 while the semiconductor device 40 is translated, or scanned, relative to the energy (or vice versa) delivered to the surface of the gate dielectric layer 82. In either case, the laser scan rates may be in a range from about 15 mm/second to about 650 mm/second, which may vary depending upon the desired dwell times of the application. The laser beam may be operated at a desired range of wavelengths and intensities. In some embodiments, the laser beam may have a wavelength in a range from about 200 nm to about 20 micrometers, such as from about 700 nm to about 1200 nm, for example about 950 nm to about 1000 nm, and an energy density in a range from about 0.1 W/cm$^2$ to about 10 W/cm$^2$. The laser anneal process can be performed so that each portion having the laser beam incident thereon can be momentarily elevated to a temperature of about 600° C. or greater, such as about 800° C. or greater, for example in a range from about 850° C. to about 1400° C.

During the laser anneal process, the chamber pressure may be maintained at about 40 Torr or above, such as about 450 Torr or above, for example in a range from about 650 Torr to about 850 Torr. In some embodiments, the chamber pressure is maintained at atmospheric pressure (760 Torr). The dwell time of the laser beam may be in a range from about 0.01 milliseconds to about 100 milliseconds, such as about 0.1 milliseconds to about 1 millisecond, for example 0.2 milliseconds. In cases where a nanosecond anneal is desired, the dwell time of the laser beam may be in a range from about 1 nanosecond to about 100 nanoseconds.

The energy source is then turned-off to allow the semiconductor device 40 to cool down. The semiconductor device 40 can be cooled down using any suitable technology for cooling the substrate, such as by circulating nitrogen, argon, or any suitable cooling liquid such as water through the substrate support. It is contemplated that the above conditions may be adjusted depending on, for instance, the absorbing properties of the material being annealed, and the speed of the substrate being translated, or scanned, relative to the laser beam delivered to the desired region of the substrate.

In some embodiments, the thermal treatment is a flash lamp anneal process performed in an ambient nitrogen-containing environment containing $NH_3$ and/or $N_2$. Such ambient nitrogen-containing environment may be created in a process chamber by introducing a gas consisting of, consisting essentially of, or comprising a nitrogen-containing gas such as $N_2$, $NH_3$, a combined gas of $N_2$ and $H_2$, and/or any mixtures thereof. In some examples, the ambient nitrogen-containing environment is created using $NH_3$ and $N_2$. $N_2$ and $NH_3$ may be separately introduced into the process chamber in any desired order, or $N_2$ and $NH_3$ may be pre-mixed as a gas mixture and introduced into the process chamber. In either case, the volumetric percentage of $NH_3$ in the ambient environment may be in a range of about 10% to about 100%, such as about 40% to about 95%, for example about 50% to about 85%, or about 65% to about 80%, with the rest being $N_2$. In one embodiment, the volumetric percentage of $NH_3$ in the ambient environment is 50%. In one embodiment, the volumetric percentage of $NH_3$ in the ambient environment is 70%. This percentage can be adjusted to obtain the desired crystallinity for the gate dielectric layer 82. The higher the volumetric percentage of $NH_3$, generally, the lower the crystallinity of the gate dielectric layer 82 may be. In most cases, the flash lamp anneal process can recrystallize the gate dielectric layer 82 to provide a crystallinity of at least 40% or above, such as about 50% to about 90%, for example about 50% to about 70%.

Likewise, before and/or while the nitrogen-containing gas is introduced into the process chamber, the substrate support (e.g., a chuck for supporting the semiconductor device 40) is pre-heated and maintained at a pre-heat temperature in a range from about 450° C. to about 850° C., such as about 500° C. to about 820° C., for example about 600° C. to about 800° C. The substrate support may be maintained at the pre-heat temperature for a duration in a range from about 3 seconds to about 20 seconds, for example about 4 seconds to about 6 seconds. Once the semiconductor device 40 reaches the pre-heat temperature and is stabilized, a flash lamp anneal process is performed by irradiating the exposed surface of the gate dielectric layer 82 with light from a light source. In some examples, the entire exposed surface of the gate dielectric layer 82 is irradiated with light in the presence of $NH_3$ and $N_2$ to form a nitride layer, such as the nitrided layer 69 of FIG. 7, in the gate dielectric layer 82.

The light source may be a plurality of radiation-emitting lamps, such as xenon, argon, or krypton discharge lamps, or tungsten halogen lamps. In some embodiments, the light source is a xenon flash lamp. During the flash lamp anneal process, the chamber pressure may be maintained in a range of about 1 Torr to about 100 Torr, such as about 10 Torr to about 100 Torr, for example about 20 Torr to about 40 Torr. The light may have an irradiation energy density of about 5 $J/cm^2$ to about 60 $J/cm^2$, for example about 10 $J/cm^2$ to about 45 $J/cm^2$. The flash lamp anneal process is performed so that an exposed surface of the gate dielectric layer 82 having the light incident thereon can be momentarily elevated to a temperature of about 600° C. or greater, such as about 800° C. or greater, for example in a range from about 850° C. to about 1400° C. The irradiation time may be for a duration in a range about 0.1 milliseconds to about 100 milliseconds, such as about 0.2 milliseconds to about 5 milliseconds, for example about 1.4 milliseconds to about 2 milliseconds.

The light source is then turned-off to allow the semiconductor device 40 to cool down. The semiconductor device 40 can be cooled down using any suitable technology for cooling the substrate, such as by circulating nitrogen, argon, or any suitable cooling liquid such as water through the substrate support. It is contemplated that the above conditions and achievable final temperature of the portion having the light incident thereon may vary depending on the intensity of the light flash and on the optical properties of the annealed material.

A person having ordinary skill in the art should readily understand that the above process(es) and parameters may be equally applicable to other layers in the gate stack, such as one or more barrier and/or capping layers and one or more work-function tuning layers to be subsequently deposited over the gate dielectric layer 82. The parameters discussed in this disclosure may vary depending upon the application and/or the sizes of respective components of the semiconductor device structure.

Figure 8:
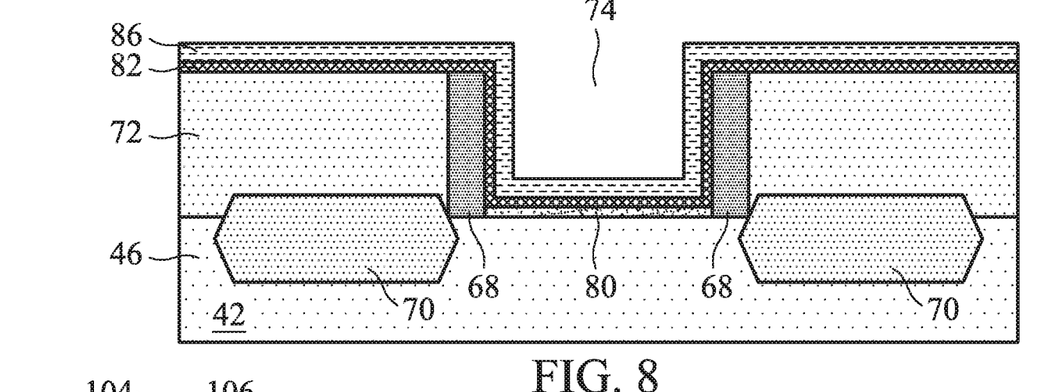

FIG. 8 illustrates a barrier layer 86 is conformally deposited over the gate dielectric layer 82. The barrier layer 86 may include or be tantalum nitride, tantalum-silicon nitride, tantalum-carbon nitride, tantalum-aluminum nitride, titanium nitride, titanium-silicon nitride, titanium-carbon nitride, titanium-aluminum nitride, aluminum nitride, the like, or a combination thereof, and may be deposited by ALD, PECVD, MBD, or any suitable deposition technique. In some embodiments, the barrier layer 86 is a titanium-silicon nitride. The barrier layer 86 can have a thickness in a range from about 5 Å to about 30 Å.

Figure 9:
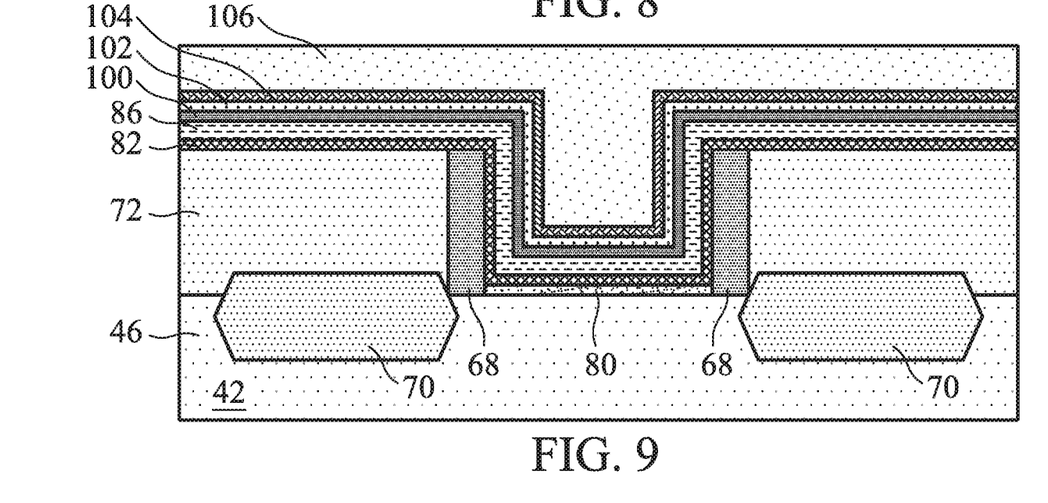

FIG. 9 illustrates a first work-function tuning layer 100, a second work-function tuning layer 102, a barrier/adhesion layer 104, and a gate metal fill 106 sequentially formed over the barrier layer 86. The first work-function tuning layer 100 is conformally deposited on the barrier layer 86. The first work-function tuning layer 100 may include or be titanium nitride (TiN), titanium-silicon nitride, titanium-carbon nitride, titanium-aluminum nitride, tantalum nitride, tantalum-silicon nitride ($TaSi_xN_y$), tantalum-carbon nitride, tungsten nitride, tungsten carbide, tungsten-carbon nitride, cobalt, platinum, the like, or a combination thereof, and may be deposited by ALD, PECVD, MBD, or any suitable deposition technique. The first work-function tuning layer 100 can have a thickness in a range from about 5 Å to about 60 Å. The second work-function tuning layer 102 is conformally deposited on the first work-function tuning layer 100. The second work-function tuning layer 102 may include or be titanium aluminum carbide (TiAlC), a titanium aluminum alloy, tantalum-aluminum carbide, the like, or a combination thereof, and may be deposited by ALD, PECVD, MBD, or any suitable deposition technique. The second work-function tuning layer 102 can have a thickness in a range from about 10 Å to about 60 Å. In some examples, the first or second work-function tuning layer 100, 102 may be omitted. Other examples can have various other configurations of work-function tuning layers to achieve a desired performance of the device to be formed. For example, any different number of work-function layers having various materials and/or thicknesses may be used. In some instances, for example, a p-type FET and an n-type FET may have different work-function tuning layer(s).

The barrier/adhesion layer 104 is conformally deposited on the second work-function tuning layer 102. The barrier/adhesion layer 104 may include or be titanium nitride, titanium-silicon nitride, titanium-carbon nitride, titanium-aluminum nitride, tantalum nitride, tantalum-silicon nitride, tantalum-carbon nitride, tungsten nitride, tungsten carbide, tungsten-carbon nitride, the like, or a combination thereof, and may be deposited by ALD, PECVD, MBD, or any suitable deposition technique. The barrier/adhesion layer 104 can have a thickness in a range from about 10 Å to about 50 A. The gate metal fill 106 is then deposited on the barrier/adhesion layer 104. The gate metal fill 106 can fill remaining recess 74 where the dummy gate stack was removed. The gate metal fill 106 may be or comprise a metal-containing material such as tungsten, cobalt, ruthenium, aluminum, copper, multi-layers thereof, or a combination thereof. The gate metal fill 106 can be deposited by ALD, PECVD, MBD, PVD, or any suitable deposition technique.

Figure 10:
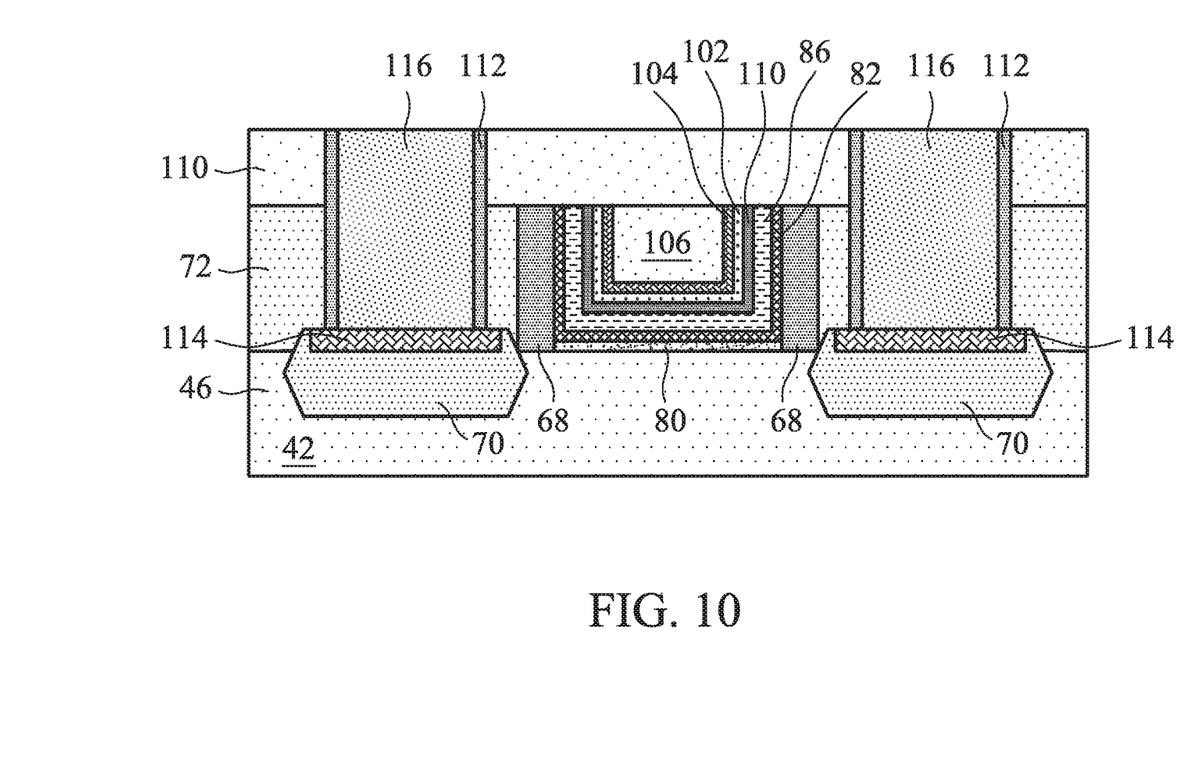

FIG. 10 illustrates the removal of excess portions of the gate metal fill 106, barrier/adhesion layer 104, second work-function tuning layer 102, first work-function tuning layer 100, barrier layer 86, and gate dielectric layer 82 above the top surfaces of the first ILD 72 and gate spacers 68. For example, a planarization process, like a CMP, may be used to remove the portions of the gate metal fill 106, barrier/adhesion layer 104, second work-function tuning layer 102, first work-function tuning layer 100, barrier layer 86, and gate dielectric layer 82 above the top surfaces of the first ILD 72 and gate spacers 68. A replacement gate structure comprising the gate metal fill 106, barrier/adhesion layer 104, second work-function tuning layer 102, first work-function tuning layer 100, barrier layer 86, and gate dielectric layer 82 may therefore be formed.

FIG. 10 also illustrates the formation of a second ILD 110. The second ILD 110 is deposited over the first ILD 72, replacement gate structure, and gate spacers 68. An etch stop layer (ESL) may be implemented between, e.g., the first ILD 72 and the second ILD 110. For example, the ESL may be deposited over the first ILD 72, replacement gate structure, and gate spacers 68. Then, for example, the second ILD 110 is deposited over the ESL. The ESL and the second ILD 110 can be or include the same or similar materials, and can be deposited using any acceptable techniques, as described above with respect to the CESL and the first ILD 72, respectively. The second ILD 110 can be planarized, such as by a CMP, after being deposited.

FIG. 10 further illustrates the formation of conductive features through the second ILD 110 and first ILD 72 to the source/drain regions 70. Openings are formed through the second ILD 110 and the first ILD 72. Each of the openings exposes a respective source/drain region 70. The openings may be formed using, for example, appropriate photolithography and etch processes. A liner 112 may be formed in the openings. The liner 112 can be conformally deposited along sidewalls of the openings and top surfaces of the source/drain regions 70. The liner 112 may be a diffusion barrier layer, an adhesion layer, or the like. The liner 112 may include or be titanium, titanium nitride, tantalum, tantalum nitride, or the like, and may be deposited by any suitable deposition technique. An anneal process may be performed to facilitate a reaction between at least respective portions of the liner 112 and the source/drain regions 70 to form silicide regions 114 at the respective source/drain regions 70. A conductive material 116 is then formed on the liner 112 in the openings. The conductive material 116 may be or include a metal, such as cobalt, tungsten, copper, aluminum, gold, silver, alloys thereof, the like, or a combination thereof, and may be deposited by any suitable deposition technique. A planarization process, such as a CMP, may be performed to remove excess conductive material 116 and liner 112 from the top surface of the second ILD 110. The remaining liner 112, silicide regions 114, and conductive material 116 form the conductive features to the respective source/drain regions 70.

The semiconductor device 240 may undergo further processing to form various features and regions. For example, subsequent processing may form various contacts/vias/lines and multilayers of interconnect features (e.g., metal layers and interlayer or intermetal dielectrics) on the semiconductor substrate 42 including the semiconductor device 40, configured to connect the various features to form a functional circuit that may include one or more devices (e.g., one or more semiconductor devices 40).

Embodiments described in this disclosure relate to formation of a gate structure of a device, such as in a replacement gate process, and the device formed thereby. In some examples, after an interfacial layer and a gate dielectric layer are deposited, a rapid anneal process, such as laser anneal or flash lamp anneal process, is performed in a controlled ambient nitrogen-containing environment to form a nitrided portion in the gate dielectric layer. The nitrided portion passivates the defects at the surface of the gate dielectric layer and can serve as a barrier to prevent etchant chemistry and defects/dopants from the subsequent gate stack layers from affecting or diffusing through the gate dielectric layer. Particularly, the rapid anneal process is performed on a millisecond scale to confine nitrogen atoms in the gate dielectric layer without diffusing into the underlying interfacial dielectric and/or any neighboring structure such as fin. Millisecond annealing process performing in a controlled nitrogen-containing ambient can obtain the desired nitrogen concentration in the gate dielectric layer without excessive regrowth of the interfacial layer. Such ultra short annealing process can further re-activate dopants in the source/drain regions (that were deactivated due to the low temperature deposition processes used during formation of ILD0 (e.g., first ILD 72) or gate spacers) with minimized diffusion of the dopants from the source/drain regions. As a result, short channel effect is prevented. Among other benefits, device degradation, such as time-dependent dielectric breakdown (TDDB), and device performance can be improved.

In an embodiment, a method for semiconductor processing is provided. The method includes conformally forming a gate dielectric layer over a fin extending from a substrate and along sidewalls of gate spacers over the fin, nitriding the gate dielectric layer in an ammonia-containing ambient environment using a laser anneal process or a flash lamp anneal process, and forming one or more metal-containing layers over the gate dielectric layer.

In another embodiment, a method is provided. The method includes forming an interfacial dielectric along a surface of a fin extending from a substrate, forming a gate dielectric layer over the interfacial dielectric, nitriding the gate dielectric layer in an ambient environment containing $NH_3$ using a laser beam or a radiation-emitting lamp, and forming a metal gate electrode over the gate dielectric layer In one another embodiment, a structure is provided. The structure includes a substrate having a fin extending from the substrate, a nitrogen-free interfacial dielectric along a surface of the fin, and a gate structure over the fin, a work-function tuning layer over the gate dielectric layer, and a gate metal fill over the work-function tuning layer. The gate structure includes a gate dielectric layer over the interfacial dielectric, wherein the gate dielectric layer has a nitride portion having a concentration of nitrogen in a range from about $0.5 \times 10^{21}$ atom/cm$^3$ to about $8 \times 10^{21}$ atom/cm$^3$.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for semiconductor processing, the method comprising:
   conformally forming a gate dielectric layer over a fin extending from a substrate and along sidewalls of gate spacers over the fin, the gate dielectric layer being amorphous;
   nitriding the gate dielectric layer in an ammonia-containing ambient environment while using a laser anneal process or a flash lamp anneal process, the nitriding simultaneously crystallizing the gate dielectric layer; and
   forming one or more metal-containing layers over the gate dielectric layer.

2. The method of claim 1, wherein nitriding the gate dielectric layer is performed by the laser anneal process operating at a chamber pressure in a range from 650 Torr to 850 Torr and using a laser beam having a dwell time in a range from 0.1 milliseconds to 1 millisecond.

3. The method of claim 2, further comprising:
   prior to performing the laser anneal process, preheating a substrate support on which the substrate is disposed to a pre-heat temperature in a range from 200° C. to 600° C. for a duration in a range from 2 seconds to 20 seconds.

4. The method of claim 2, wherein the laser beam is scanned across an exposed surface of the gate dielectric layer at a scan rate in a range from 15 mm/second to 650 mm/second.

5. The method of claim 4, wherein the laser anneal process is performed so that each portion of the gate dielectric layer having the laser beam incident thereon is elevated to a temperature in a range from 850° C. to 1400° C.

6. The method of claim 1, wherein nitriding the gate dielectric layer is performed by the flash lamp anneal process operating at a chamber pressure in a range from 10 Torr to 100 Torr and using a radiation-emitting lamp having an irradiation time in a range from 0.2 milliseconds to 5 milliseconds.

7. The method of claim 6, wherein the flash lamp anneal process is performed so that an exposed surface of the gate dielectric layer having radiation from the radiation-emitting lamp incident thereon is elevated to a temperature in a range from 850° C. to 1400° C.

8. The method of claim 6, wherein the ammonia-containing ambient environment further comprises $N_2$, and the $N_2$ has a volumetric percentage of about 10% to about 100% in the ammonia-containing ambient environment.

9. The method of claim 6, further comprising:
prior to performing the flash lamp anneal process, preheating a substrate support on which the substrate is disposed to a pre-heat temperature of about 450° C. to about 850° C. for about 3 seconds to about 20 seconds.

10. A method for semiconductor processing, the method comprising:
forming an interfacial dielectric along a surface of a fin extending from a substrate;
forming a gate dielectric layer over the interfacial dielectric, wherein the gate dielectric layer is formed as an amorphous layer;
preheating a substrate support on which the substrate is disposed;
after preheating the substrate support, nitriding the gate dielectric layer in an ambient environment containing $NH_3$ while using a laser beam or a radiation-emitting lamp, wherein nitriding the gate dielectric layer crystallizes the gate dielectric layer; and
forming a metal gate electrode over the gate dielectric layer.

11. The method of claim 10, wherein the ambient environment further comprises $N_2$.

12. The method of claim 10,
wherein preheating the substrate support on which the substrate is disposed is performed to a pre-heat temperature in a range from 450° C. to 850° C.

13. The method of claim 10, wherein the $NH_3$ in the ambient environment has a volumetric percentage in a range from 10% to 100% in the ambient environment.

14. The method of claim 10, wherein nitriding the gate dielectric layer is performed by irradiating an exposed surface of the gate dielectric layer with radiation from the radiation-emitting lamp so that the exposed surface of the gate dielectric layer having the radiation incident thereon is elevated to a temperature in a range from 850° C. to 1400° C. for a duration in a range from 0.2 milliseconds to 5 milliseconds.

15. A method for semiconductor processing, the method comprising:
forming an interfacial dielectric along a surface of a fin extending from a substrate;
forming a gate dielectric over the interfacial dielectric;
wherein the gate dielectric layer is formed as an amorphous layer;
preheating a substrate support on which the substrate is disposed;
after preheating the substrate support, nitriding the gate dielectric layer in an ambient environment containing $NH_3$ while using a laser beam or a radiation-emitting lamp;
wherein nitriding the gate dielectric layer crystallizes the gate dielectric layer; and
forming a metal gate electrode over the gate dielectric layer.

16. A method for semiconductor processing, the method comprising:
forming an interfacial layer over a fin;
forming a gate dielectric layer over the interfacial layer, the gate dielectric layer being formed as an amorphous layer;
nitriding and crystallizing the gate dielectric layer using a laser anneal process or a flash lamp anneal process while in a nitrogen-containing environment, while the laser anneal process or the flash lamp anneal process is a millisecond timescale or below anneal process; and
forming one or more metal-containing layers over the gate dielectric layer.

17. The method of claim 16, wherein the fin is part of a substrate, and further comprising:
prior to nitriding the gate dielectric layer, preheating a substrate support on which the substrate is disposed to a pre-heat temperature in a range from 450° C. to 850° C.

18. The method of claim 16, wherein a ratio of a thickness of the gate dielectric layer to a thickness of a nitridated portion of the gate dielectric layer is in a range from 1:1.1 to 1:2.5.

19. The method of claim 16, wherein a dwell time of the laser anneal process is from 0.1 milliseconds to 1 millisecond.

20. The method of claim 16, wherein a radiation time of the flash lamp anneal process is in a range from 0.2 milliseconds to 5 milliseconds.

* * * * *